United States Patent
Oikawa et al.

(10) Patent No.: US 11,328,934 B2
(45) Date of Patent: May 10, 2022

(54) ETCHING METHOD AND SUBSTRATE PROCESSING APPARATUS

(71) Applicant: Tokyo Electron Limited, Tokyo (JP)

(72) Inventors: Sho Oikawa, Miyagi (JP); Wakako Ishida, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/977,898

(22) PCT Filed: Jun. 24, 2019

(86) PCT No.: PCT/JP2019/024947
§ 371 (c)(1),
(2) Date: Sep. 3, 2020

(87) PCT Pub. No.: WO2020/008933
PCT Pub. Date: Jan. 9, 2020

(65) Prior Publication Data
US 2020/0411326 A1    Dec. 31, 2020

(30) Foreign Application Priority Data
Jul. 4, 2018   (JP) .............................. JP2018-127816

(51) Int. Cl.
*H01L 21/311*   (2006.01)
*H01J 37/32*    (2006.01)
(Continued)

(52) U.S. Cl.
CPC .. *H01L 21/31138* (2013.01); *H01J 37/32082* (2013.01); *H01J 37/32449* (2013.01);
(Continued)

(58) Field of Classification Search
None
See application file for complete search history.

(56) References Cited

U.S. PATENT DOCUMENTS 5,882,535 A * 3/1999 Stocks ............. H01L 21/31116
                                                    216/18
5,942,446 A * 8/1999 Chen ................ H01L 21/31144
                                                   438/734

(Continued)

FOREIGN PATENT DOCUMENTS

| JP | 2004-158538 | 6/2004 |
| JP | 2010-041028 | 2/2010 |
| JP | 2011-199243 | 10/2011 |

*Primary Examiner* — Allan W. Olsen
(74) *Attorney, Agent, or Firm* — IPUSA, PLLC

(57) ABSTRACT

Provided is an etching method performed in a substrate-processing apparatus having: a first electrode on which a substrate is placed; and a second electrode facing the first electrode, the method comprising: a first step for introducing a first gas and halfway etching a target film into a pattern of a predetermined film on the target film formed on the substrate; a second step for introducing a second gas including Ar gas, H2 gas, and deposition gas and applying DC voltage to the second electrode to form a protective film, the second step being performed after the first step; and a third step for introducing a third gas and etching the target film, the third step being performed after the step for forming the protective film.

12 Claims, 10 Drawing Sheets

(51) Int. Cl.
*H01L 21/02* (2006.01)
*H01L 21/67* (2006.01)

(52) U.S. Cl.
CPC .... *H01J 37/32532* (2013.01); *H01L 21/0212* (2013.01); *H01L 21/67069* (2013.01); *H01J 2237/334* (2013.01)

(56) References Cited

U.S. PATENT DOCUMENTS

| | | | | |
|---|---|---|---|---|
| 6,051,503 | A * | 4/2000 | Bhardwaj | H01L 21/30655 216/37 |
| 6,569,774 | B1 * | 5/2003 | Trapp | H01L 21/31116 257/E21.252 |
| 6,617,253 | B1 * | 9/2003 | Chu | H01L 21/31116 438/702 |
| 6,833,325 | B2 * | 12/2004 | Huang | H01L 21/31116 257/E21.252 |
| 7,169,695 | B2 * | 1/2007 | Huang | H01L 21/31116 257/E21.252 |
| 7,238,629 | B2 * | 7/2007 | Shioya | C23C 16/401 438/789 |
| 8,518,830 | B2 * | 8/2013 | Igarashi | H01L 21/31122 438/700 |
| 9,208,997 | B2 * | 12/2015 | Nishimura | H01L 21/32139 |
| 2014/0134848 | A1 * | 5/2014 | Hisamatsu | H01L 21/0273 438/725 |

* cited by examiner

FIG.2 RELATED ART
(a)
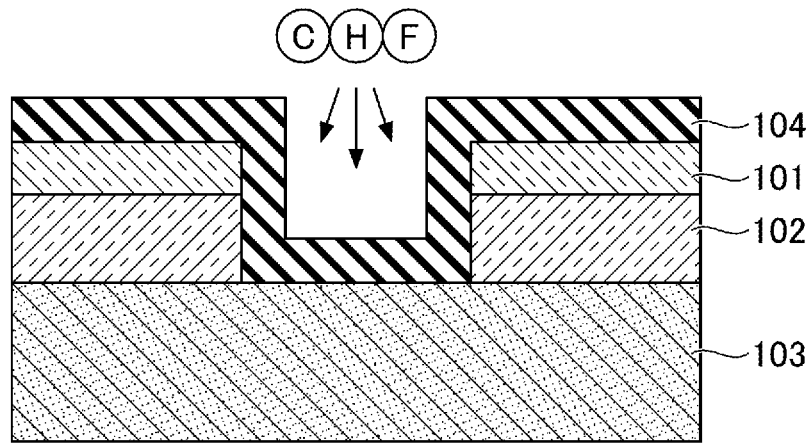
(b)
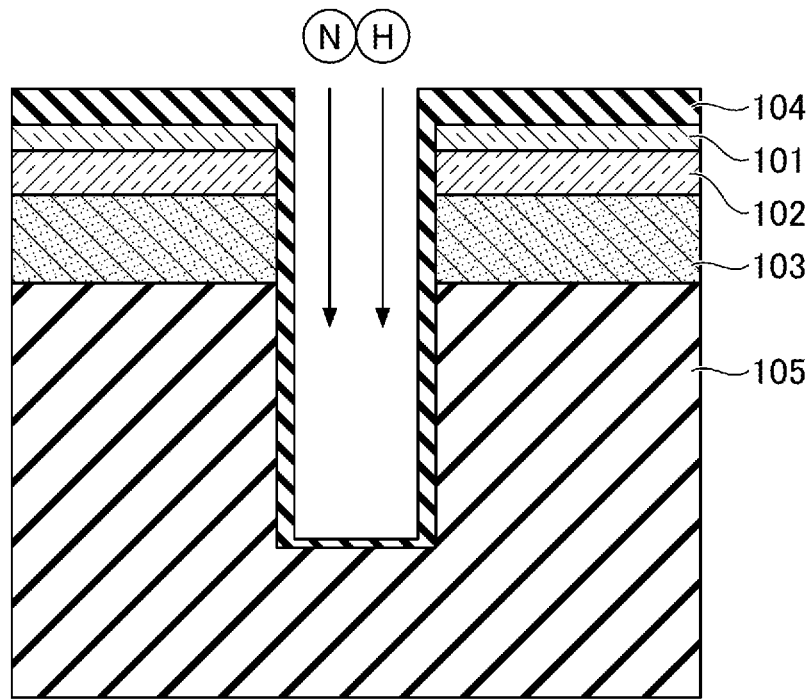

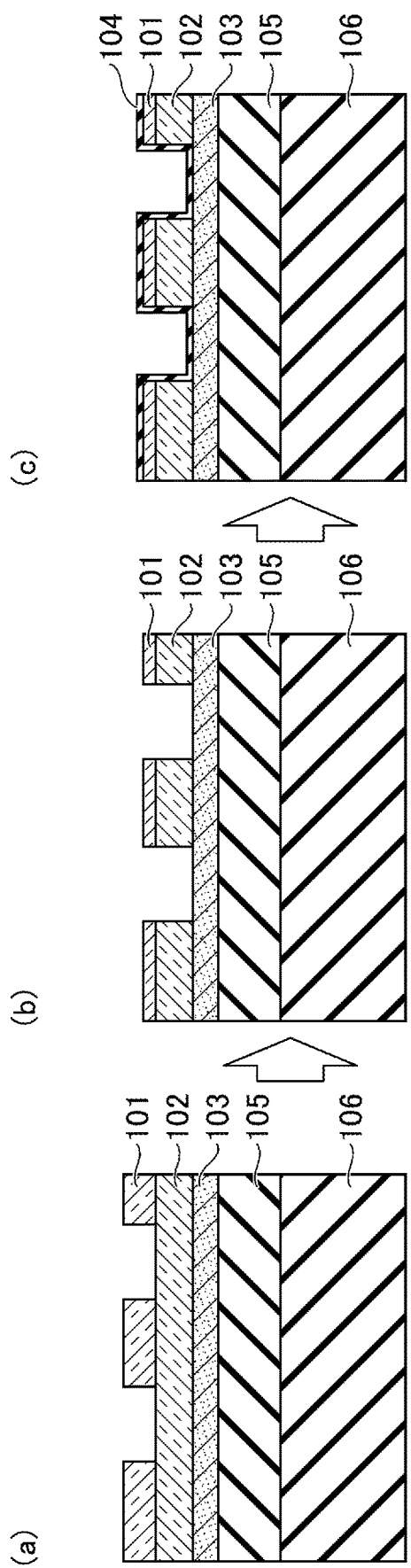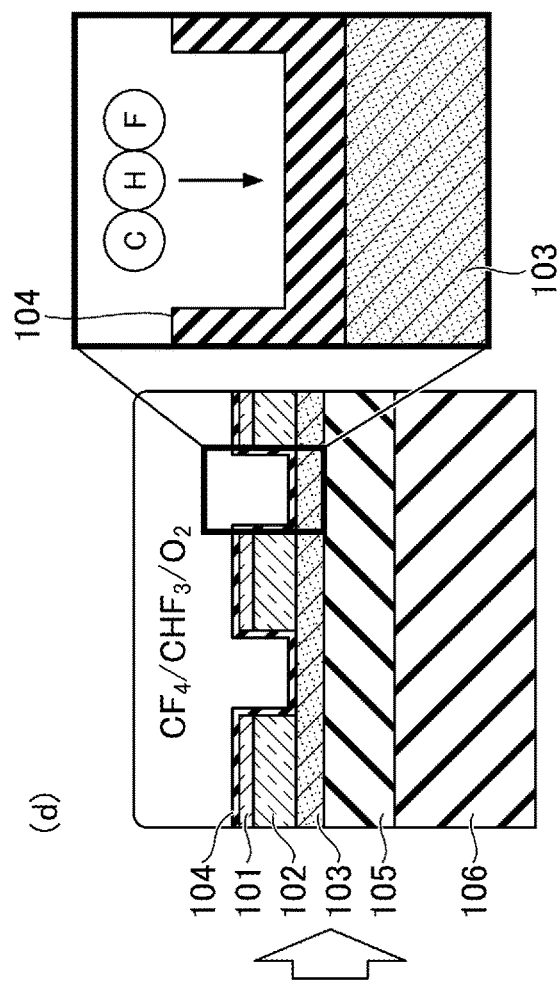
FIG.4 RELATED ART

FIG.10

| AFTER SILICON OXIDE FILM ETCHING | Center | | Edge | |
|---|---|---|---|---|
| | SECOND PROCESS NOT INCLUDED | SECOND PROCESS INCLUDED | SECOND PROCESS NOT INCLUDED | SECOND PROCESS INCLUDED |
| Top-CD | 22.5 nm | 17.2 nm | 23.8 nm | 17.2 nm |
| Max-CD | 23.8 nm | 18.5 nm | 25.1 nm | 19.0 nm |
| Bottom-CD | 15.9 nm | 12.9 nm | 17.2 nm | 14.5 nm |

US 11,328,934 B2

ETCHING METHOD AND SUBSTRATE PROCESSING APPARATUS

TECHNICAL FIELD

The present disclosure relates to an etching method and a substrate processing apparatus.

BACKGROUND ART

Patent Document 1 discloses a method of processing a wafer in which amorphous carbon films, SiON films, anti-reflection films, and photoresist layers are sequentially layered on a silicon substrate, and the photoresist layer has an opening that expects a part of the anti-reflection film. Patent Document 1 proposes depositing a deposit on a side wall of the opening of the photoresist film to reduce the opening width of the opening to a predetermined width.

Patent Document 2 discloses an etching process that can prevent a pattern from being distorted even when an aspect ratio of the pattern to be formed is high.

PRIOR ART DOCUMENTS

Patent Documents

Patent Document 1: Japanese Laid-Open Patent Application Publication No. 2010-41028
Patent Document 2: Japanese Laid-Open Patent Application Publication No. 2011-199243

SUMMARY OF THE INVENTION

Problem to be Solved by the Invention

The present disclosure provides a technique for reducing an opening width of a target film without generating an etching defect.

Means for Solving the Problem

According to one embodiment of the present disclosure, there is provided an etching method in a substrate processing apparatus including a first electrode on which a substrate is mounted and a second electrode facing the first electrode, including a first step of etching a target film on a substrate halfway into a pattern of a predetermined film on the target film by introducing a first gas, a second stop of forming a protective film by introducing a second gas containing Ar gas, $H_2$ gas, and a sedimentary gas and applying a DC voltage to the second electrode after performing the first step, and a third step of etching the target film by introducing a third gas after performing the step of forming the protective film.

Advantageous Effect of the Invention

According to one aspect, an opening width of a target film can be reduced without an etching failure.

BRIEF DESCRIPTION OF THE DRAWINGS

FIG. 2 is a diagram illustrating a conventional etching method and an etching method according to an embodiment;
FIG. 4 is a diagram illustrating a film patterned by a conventional etching process;
FIG. 10 is a diagram view illustrating an example of an experimental result of an etching method according to an embodiment.

EMBODIMENTS FOR IMPLEMENTING THE INVENTION

Hereinafter, embodiments for carrying out the present disclosure will be described with reference to the drawings. In the present specification and drawings, as for substantially the same structure, the overlapping description will be omitted by providing the same numerals.

Overall Configuration of Substrate Processing Apparatus

Figure 1:
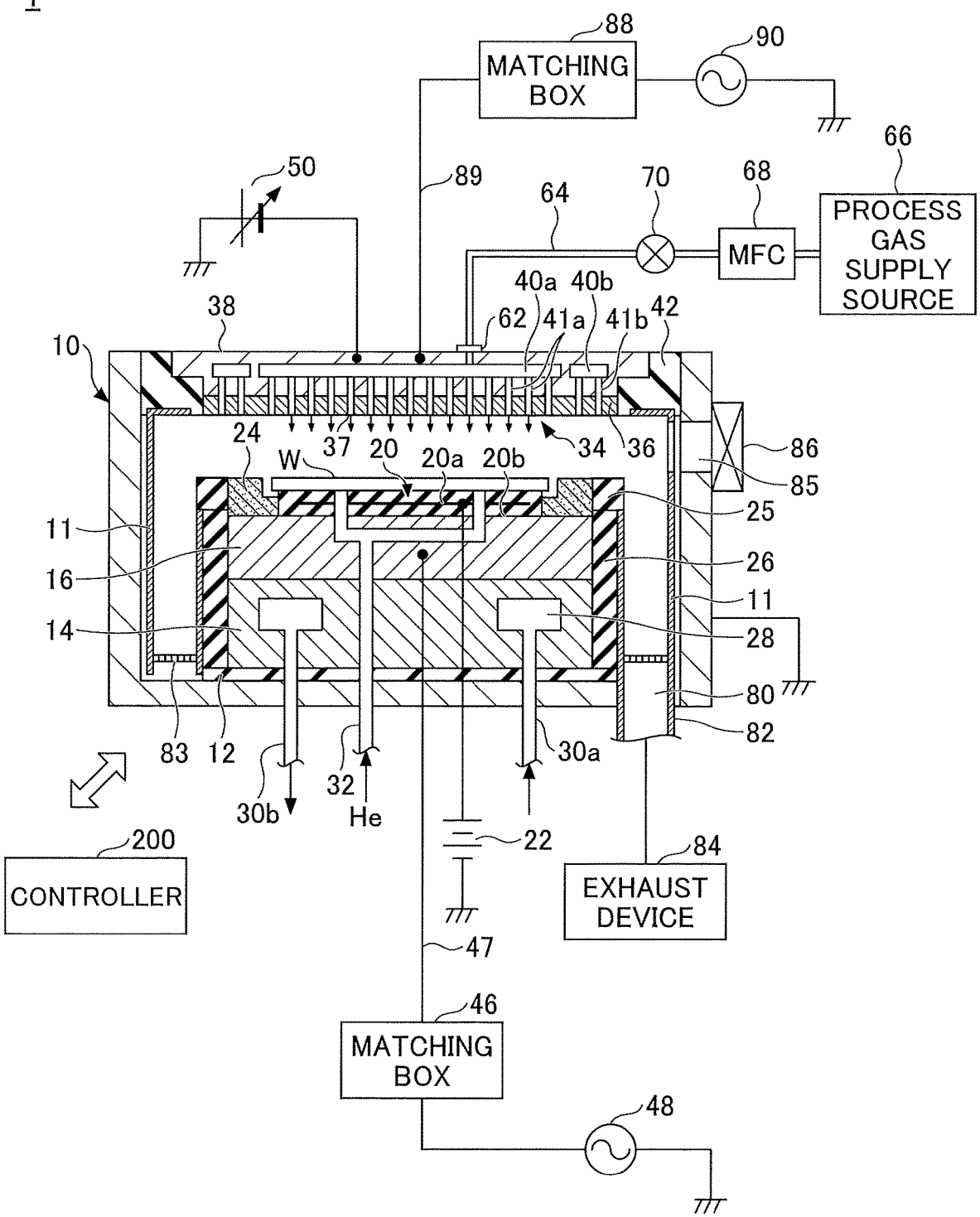
FIG. 1 is a diagram illustrating an example of a substrate processing apparatus according to an embodiment.

FIG. 1 is a diagram illustrating an example of a substrate processing apparatus 1 according to an embodiment. The substrate processing apparatus 1 according to the present embodiment is a capacitively coupled parallel plate substrate processing apparatus, and includes a cylindrical processing chamber 10, for example, made of aluminum, having an anodized surface. The processing chamber 10 is grounded.

At the bottom of the processing chamber 10, a cylindrical support platform 14 is disposed through an insulating plate 12 made of ceramics or the like, on which a mounting stage 16, for example, made of aluminum, is provided. The mounting stage 16 forms a lower electrode on which a wafer W, which is an example of a substrate, is placed on an electrostatic chuck 20.

The electrostatic chuck 20 adsorbs and holds the wafer W by an electrostatic force. The electrostatic chuck 20 has a structure in which an electrode 20a made of a conductive film is sandwiched between insulating layers 20b, and a DC power supply 22 is connected to the electrode 20a. The wafer W is adsorbed and held on the electrostatic chuck 20 by an electrostatic force, such as a coulomb force generated by the DC voltage from the DC power supply 22. The electrostatic chuck 20 may include a heater and may control temperature.

A conductive edge ring 24, e.g., made of silicon, is disposed on the mounting stage 16 around the periphery of the wafer W. The outer periphery of the mounting stage 16 and support platform 14 include a cylindrical inner wall member 26 made of, for example, quartz. An insulator ring 25 is provided on the outer periphery of the edge ring 24.

A refrigerant chamber 28 is inside the support platform 14, for example, on a circumference. The refrigerant chamber 28 is supplied with a refrigerant, such as cooling water, at a predetermined temperature from a chiller unit disposed externally through pipes 30a and 30b, and the processing temperature of the wafer W on the mounting stage 16 is controlled by the refrigerant temperature. In addition, a heat transfer gas, e.g., He gas, from the heat transfer gas supply mechanism is supplied through the gas supply line 32 to a location between the top surface of the electrostatic chuck 20 and the back surface of the wafer W.

An upper electrode 34 is disposed above the mounting stage 16 opposite the mounting stage 16. A space between the upper electrode 34 and the bottom electrode becomes a plasma processing space. The upper electrode 34 forms a face that faces the wafer W on the mounting stage 16 and contact the plasma processing space, that is, an opposing face. The mounting stage 16 (bottom electrode) is an example of a first electrode on which a substrate is mounted, and an upper electrode 34 is an example of a second electrode facing the first electrode.

The upper electrode 34 is supported at an upper portion of the processing chamber 10 via an insulative shielding member 42. The upper electrode 34 includes an electrode plate 36 that forms a facing surface of the mounting stage 16 and that has a number of gas discharge holes 37, and an electrode support 38 that is made of a conductive material, e.g., aluminum, which is anodized on the surface of the electrode plate 36 and that removably supports the electrode plate 36. The electrode plate 36 is preferably made of a silicon-containing material such as silicon or SiC. Inside the electrode support 38 are gas diffusion chambers 40a, 40b from which a number of gas flow holes 41a, 41b in communication with the gas discharge holes 37 extend downward.

The electrode support 38 includes a gas inlet 62 that leads a gas to the gas diffusion chambers 40a and 40b, to which a gas supply line 64 is connected, and a process gas supply source 66 is connected to the gas supply line 64. The gas supply line 64 includes a mass flow controller (MFC) 68 and an open/close valve 70 from the upstream side where the process gas supply source 66 is located. Then, from the process gas supply source 66, a gas for etching reaches the gas diffusion chambers 40a and 40b via the gas supply line 64, and is discharged into the plasma processing space in a shower-like manner from the gas flow holes 41a and 41b and the gas discharge holes 37. In this manner, the upper electrode 34 serves as a showerhead for supplying gas.

A variable DC power supply 50 is connected to the upper electrode 34 and a DC voltage from the variable DC power supply 50 is applied to the upper electrode 34. The polarity and current/voltage of the variable DC power supply 50 and the control of the electronic switch to turn the current and voltage on/off are performed by the controller 200.

A first radio frequency power supply 90 is connected to the upper electrode 34 via a power supply rod 89 and a matching box 88. The first radio frequency power supply 90 applies HF (High Frequency) power to the upper electrode 34. The matching box 88 matches the internal impedance and load impedance of the first radio frequency power supply 90. This creates plasma from the gas in the plasma processing space. The HF power supplied from the first radio frequency power source 90 may be applied to the mounting stage 16.

When the HF power is applied to the upper electrode 34, the frequency of the HF may be in the range of 30 MHz to 70 MHz, for example 40 MHz. When the HF power is supplied to the mounting stage 16, the frequency of the HF power may be in the range of 30 MHz to 70 MHz, for example 60 MHz.

A second radio frequency power supply 48 is connected to the mounting stage 16 via a power supply rod 47 and a matching box 46. A second radio frequency power supply 48 supplies LF (Low Frequency) power to the mounting stage 16. The matching box 46 matches the internal impedance of the second radio frequency power supply 48 with the load impedance. This draws ions onto the wafer W on the mounting stage 16. A filter may be connected to the mounting stage 16 for passing a predetermined radio frequency to the ground.

The frequency of the LF is lower than the frequency of the HF, and the frequency of the LF may range from 200 kHz to 40 MHz, for example, may be at 12.88 MHz. The voltages or currents of the LF and the HF can be continuous waves or pulsed waves.

The bottom of the processing chamber 10 includes an exhaust port 80 to which an exhaust device 84 is connected via an exhaust pipe 82. The exhaust device 84 includes a vacuum pump, such as a turbomolecular pump, which can reduce the pressure in processing chamber 10 to a desired degree of vacuum. The side wall of the processing chamber 10 is provided with a wafer inlet/outlet port 85 that can be opened and closed by a gate valve 86. A deposit shield 11 is removably disposed along the inner wall of the processing chamber 10 to prevent a by-products (deposit) generated during etching from adhering to the processing chamber 10, and the deposit shield 11 forms the wall of the processing chamber. Also, the deposit shield 11 is provided on the outer circumference of the inner wall member 26. A baffle plate 83 is provided between the deposit shield 11 on the lateral wall side and the deposit shield 11 on the inner wall member 26 side. The deposit shield 11 and the baffle plate 83 may be made of aluminum coated with a ceramic such as $Y_2O_3$.

When the etching process is performed in the substrate processing apparatus 1 having such a configuration, first, the gate valve 86 is set to be in an open state, and the wafer W is carried into the processing chamber 10 via the inlet/outlet port 85 and mounted on the mounting stage 16. The gas for a predetermined process, such as etching, is supplied from the process gas supply source 66 to the gas diffusion chambers 40a and 40b at a predetermined flow rate and is supplied into the process chamber 10 via the gas flow holes 41a and 41b and the gas discharge holes 37. The exhaust device 84 evacuates the processing chamber 10 and sets the internal pressure in, for example, the range of 0.1 to 150 Pa.

In this manner, HF power is applied from the first radio frequency power source 90 to the upper electrode 34 with the predetermined gas introduced into the processing chamber 10. Also, LF power is applied from the second radio frequency power supply 48 to the mounting stage 16. A DC voltage is applied to the electrode 20a from the DC power supply 22, and the wafer W is held on the mounting stage 16. Also, a DC voltage from the variable DC power supply 50 is applied to the upper electrode 34.

The gas discharged from the gas discharge hole 37 of the upper electrode 34 is dissociated and ionized to produce plasma, principally by the HF power. Radicals and ions in the plasma etch, for example, the surface to be processed of the wafer W. Also, by applying the LF power to the mounting stage 16, the control margin of the plasma can be widened, which makes it possible to control ions in the plasma and to etch holes with an aspect ratio of 20 or more.

The substrate processing apparatus 1 includes a controller 200 for controlling the operation of the entire apparatus. The controller 200 performs the desired plasma processing, such as etching, according to a recipe stored in memory, such as ROM (Read Only Memory) and RAM (Random Access Memory). Process time, pressure (gas exhaust), high frequency power and voltage of HF and LF, and various gas flows, which are control information of the device depending on process conditions may be set in a recipe. A temperature in the processing chamber (the temperature of the upper electrode, the temperature of the side wall of the processing chamber, the wafer W temperature, the temperature of the electrostatic chuck, etc.), a temperature of the refrigerant output from the chiller, and the like may be also set in the recipe. The recipe representing these programs and processing conditions may be stored in a hard disk or a semiconductor memory. The recipe may also be set in a predetermined position and read out in a portable computer-readable storage medium such as a CD-ROM, a DVD, or the like.

Three-Layer Resist Via Process

There is a three-layer resist via process in which an anti-reflection film, a hard mask (anti-reflection insulation film), and an organic film are sequentially layered under the photoresist film. For example, an antireflective coating is cited as an example of a BARC (Bottom Anti-Reflective Coating) film, and a hard mask is cited as an example of a DARC (Dielectric Anti-Reflective Coating) film. An amorphous carbon film is cited as an example of an organic film.

In the three-layer resist via process, it may be required to reduce the opening width after etching the lower layer amorphous carbon film by several nm to several tens of nm for the short diameter of the oval-shaped hole after photoresist exposure.

In the conventional etching method, as illustrated in FIG. 2(a), when a protective film 104 is deposited in a hole formed in a BARC film 102 on a DARC film 103 to reduce the opening width of the hole (also referred to as a "via diameter"), etching failure may occur. One reason for the etching failure is the thick protective film 104 deposited on the bottom of the hole (also referred to as a "via bottom"). Also, the main etching gas used for the next step after the protective film 104 is the same kind of CF or CHF based gas as the protective film 104 on the via bottom, which is a CF based deposit. If the same type of gas containing C or F is used, the etching of the protective film 104 does not progress, and an etch failure such as an etch stop is likely to occur.

Figure 3:
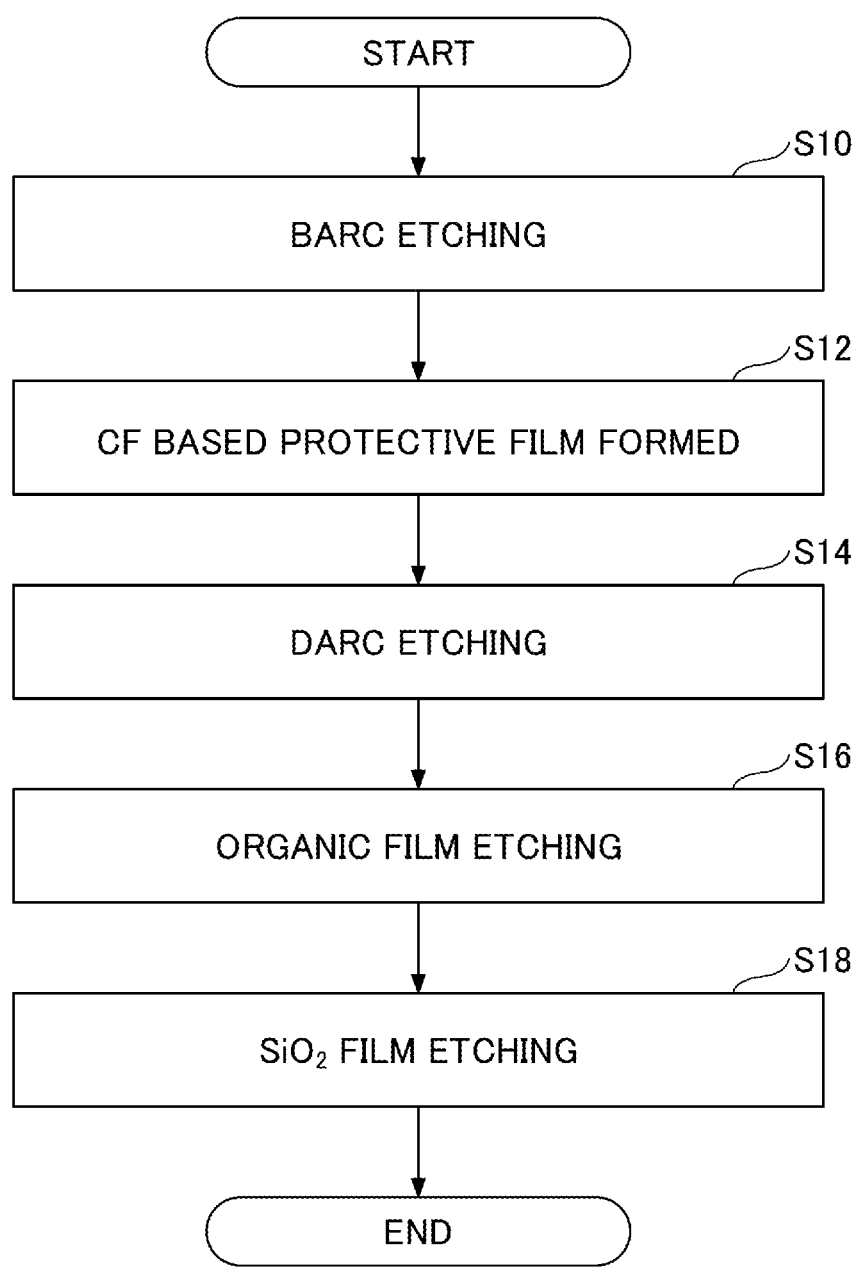
FIG. 3 is a flowchart illustrating an example of a conventional etching process.

Specifically, an example of a conventional etching method will be described with reference to FIGS. 3 and 4. FIG. 3 is a flowchart illustrating an example of a conventional etching process. FIG. 4 is a diagram illustrating a film that is patterned by a conventional etching process.

FIG. 4(a) shows an example of a layered film in an initial state. An $SiO_2$ film 106, an organic film 105, a DARC film 103, and a BARC film 102 are formed on the wafer W in order from the bottom, and a patterned photoresist film 101 is formed on the BARC film 102. By way of example, when etching a final etched target film, which is the $SiO_2$ film 106, into a pattern of the photoresist film 101, it may be necessary to reduce the opening width of the $SiO_2$ film 106 by a few nanometers to several tens of nanometers.

At this time, in the conventional etching method, the BARC film 102 is first etched into the pattern of the photoresist film 101 in step S10 of FIG. 3. FIG. 4(b) shows an etched state of the BARC film 102.

Next, a protective film 104 of the CF system is formed in step S12 of FIG. 3. FIG. 4(c) shows a state in which a protective film 104 is formed. This reduces the opening width of the hole formed in the BARC film 102.

Then, the DARC film 103 is etched in step S14 of FIG. 3; the organic film 105 is etched in step S16; the $SiO_2$ film 106 is etched in step S18; and the process ends.

However, as a result of carrying out the conventional etching method, when the DARC film 103 is etched in step S14, the deposition on the via bottom is increased relative to the deposition on the sidewalls of the protective film 104 formed in the pre-process (step S12). Therefore, in the next step (step S14), it is difficult to etch the protective film 104 on the via bottom, and an etch failure occurs.

In addition, while the CF based deposits are deposited in the process of FIG. 4(c), the main etching gas used in the next process is a gas containing the CF system or the CHF system, such as $CF_4$, $CHF_3$, and $O_2$ gases. Therefore, as shown in FIG. 4(d), deposits containing the same C and F components as the gas may not be etched well.

Accordingly, in the etching method according to one embodiment described below, the timing for forming the protective film 104 and the type of gas are optimized. This allows the via bottom of the protective film 104 to be thinned and the via diameter of the target film to be etched to be reduced without generating an etching failure using a specific gas.

Figure 5:
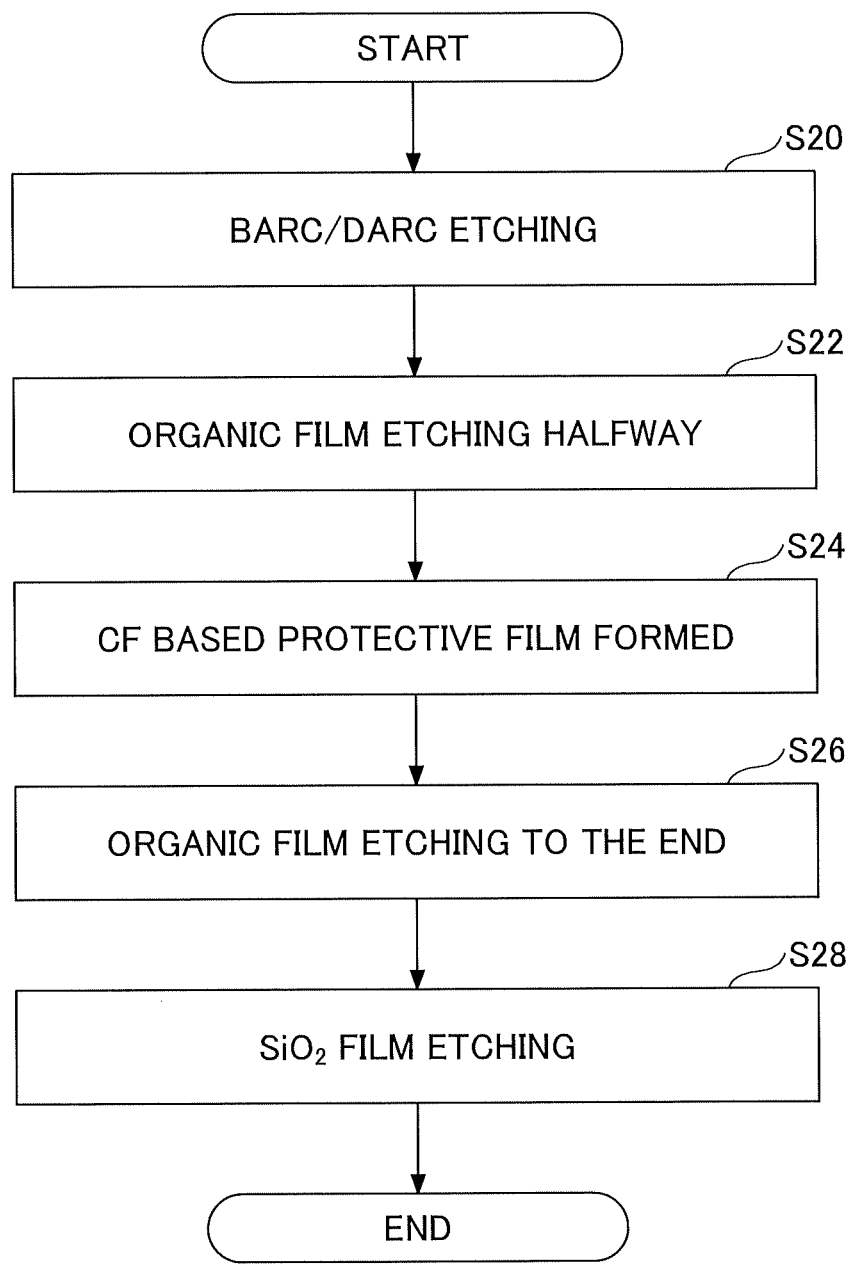
FIG. 5 is a flowchart illustrating an example of an etching process according to an embodiment.
Figure 6:
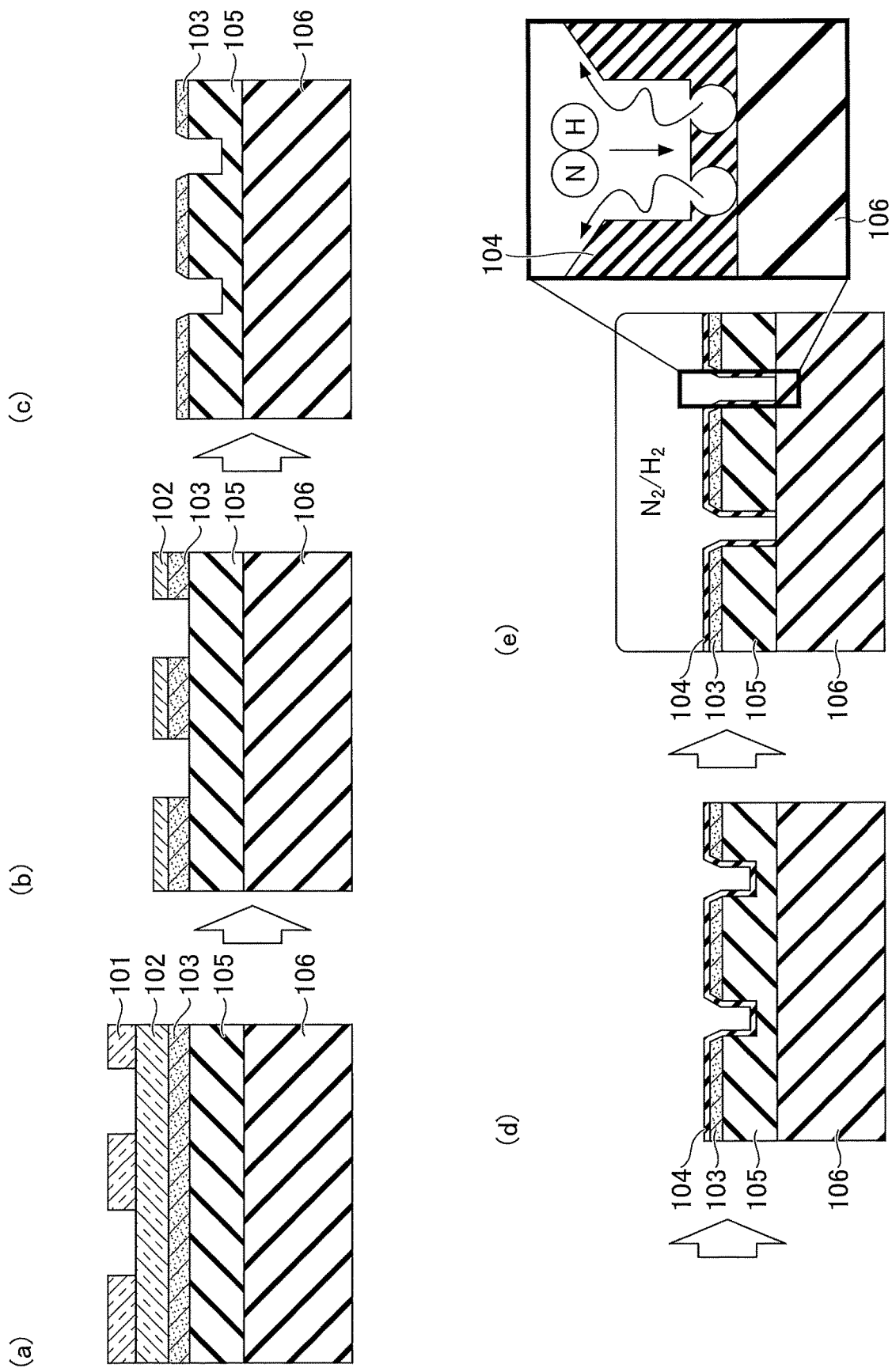
FIG. 6 is a diagram illustrating a film that is patterned by an etching process according to an embodiment.

Hereinafter, an etching method according to one embodiment will be described with reference to FIGS. 5 and 6. FIG. 5 is a flowchart illustrating an example of an etching process according to an embodiment. FIG. 6 is a diagram illustrating a film that is patterned by an etching process according to an embodiment.

An etching method according to an embodiment etches the layered film in the initial state as shown in FIG. 6(a). In the initial state of the layered film, the $SiO_2$ film 106, the organic film 105, the DARC film 103, and the BARC film 102 are layered in order from the bottom, and a patterned photoresist film 101 is formed on the BARC film 102. In one embodiment, the photoresist film 101 may use CHO or other known materials. The BARC film 102 is an example of an antireflective coating. The DARC film 103 is an example of a hard mask. The DARC film 103 may be formed from a silicon-containing film (e.g., $SiO_2$, SiON, SiOCN) or the like. The hard mask is not limited to the DARC film 103, but may be another inorganic film.

The organic film 105 may be, for example, an amorphous carbon film. In one embodiment, the step of reducing the opening width of the etching is performed during the etching of the target film using the organic film 105 as the target film. The lower layer of $SiO_2$ film 106 is then etched at a reduced opening width.

In the example sample used in the experiment, a 350 nm $SiO_2$ film 106 is formed on the top of the tungsten electrode embedded on the silicon substrate and a 300 nm organic film 105 is formed thereon. A 26 nm DARC film 103 is formed thereon, and a 25 nm BARC film 102 is formed thereon. A photoresist film 101 having a film thickness of 900 nm is formed at the top, and an elliptically shaped via pattern having a long diameter of 150 nm and a short diameter of 45 nm is formed in the photoresist film 101. In this embodiment, a sample of the layered film of the above configuration was used to perform the etching method according to one embodiment.

However, the three-layer resist via structure in which the BARC film 102, the DARC film 103, and the organic film 105 are sequentially layered is an example, but not limited to, of a layered film used for performing an etching method according to an embodiment. For example, the thickness, the shape of the pattern, the opening width, and the like of each film are not limited, and if the structure is similar, it is applicable, and the structure may not necessarily be a three-layer structure, and the structure may be a two-layer structure having either one of the BARC film 102 and the DARC film 103 and the organic film 105. The HF power may be applied to either the bottom electrode or the top electrode in all of the following steps.

Etching Process for BARC/DARC Films

The wafer W on which the layered film according to the sample example is formed is transported to the substrate processing apparatus 1, and an etching method according to one embodiment is performed under the control of the controller 200. In an etching method according to an embodiment, the BARC film 102 and the DARC film 103 are first, etched into a pattern of photoresist film 101 in step S20 of FIG. 5. FIG. 6(b) shows an etched state of a BARC film 102 and a DARC film 103. The etching conditions in this process are as follows.

Etch Condition

Pressure 45 mT to 55 mT (5.00 Pa to 7.33 Pa)
HF power 450 W to 550 W
LF power 0 W
DC voltage (top electrode applied) 405V to 495V
Gas species $CF_4$, $CHF_3$, $O_2$ In the present process, the BARC film 102 and the DARC film 103 are etched, and the process ends when a little recess (depression) is formed in the lower organic film 105.

Organic Film Etching Process/Halfway

Next, the organic film 105 is etched halfway in step S22 of FIG. 5. FIG. 6(c) shows a state in which the organic film 105 is etched halfway. The etching conditions in this process are as follows.

Etch Condition

Pressure 13.5 mT to 16.5 mT (1.80 Pa to 2.20 Pa)
HF power 450 W to 550 W
LF power 0 W
DC voltage (top electrode applied) 0 V
Gas type $O_2$, Ar In the present process, the organic film 105 is etched halfway through the process. The present process is an example of a first step in which a first gas is introduced and the target film is etched into a pattern of a predetermined film on the wafer W. The predetermined film on the target film is not limited to the DARC film 103, but may be at least one of an antireflection film and a hard mask.

The first gas is not limited to $O_2$ gas and Ar gas, but may include at least one of $O_2$, $N_2$, $H_2$, CO, $CO_2$, and Ar.

Deposition Process

Next, a CF-based protective film 104 is formed in step S24 of FIG. 5. FIG. 6(d) shows a state in which a protective film 104 is formed. This reduces the opening width of the hole etched in the organic film 105. The etching conditions in the present process are as follows.

Etch Condition

Pressure 45 to 55 mT
HF power 90 W to 110 W
LF power 0 W
DC voltage (top electrode applied) 810 V to 990 V
Gas type $CF_4$, $H_2$, Ar In the present process, not only Ar and $H_2$ but also $CF_4$ gas, which is a sedimentary gas, are supplied. The $CF_4$ gas in the gas becomes CF-based deposits in the plasma, and the deposits are deposited on the sidewalls of the organic film 105, the sidewalls of the PARC film 103 and the top surface to form a protective film 104. This reduces the opening width of the organic film 105, that is, the via diameter.

As described above, by forming deep holes with an aspect ratio of about 20 or more, deposits are difficult to be deposited on the via bottom, and problems such as etching failure are unlikely to occur. Moreover, because the amount of deposited material in the CF system due to the deposited gas increases with the via diameter and decreases with the via diameter, the resulting variation in the via diameter can be improved.

In the present process, a DC voltage is applied to the upper electrode 34. This increases the plasma density in the vicinity of the upper electrode 34. This causes ions in the plasma to sputter the top electrode 34, which scrapes the silicon forming the top electrode 34, which deposits silicon deposits, and forms the protective film 104. In the present process, when a gas containing C and F or a gas containing C, F, and H is introduced, the protective film 104 containing C, F, and silicon is formed. This reduces the via diameter. In addition, because the selectivity is increased when etching the $SiO_2$ film 106, which is the ultimately etched target film, the organic film 105 can function as a mask during etching of the $SiO_2$ film 106.

The present process is an example of a second process in which after the first step has been performed, a second gas comprising Ar gas, $H_2$ gas, and a sedimentary gas is introduced and a DC voltage is applied to the second electrode to form a protective film. The second gases are not limited to $CF_4$, $H_2$ and Ar gases. The second gas may be Ar gas, $H_2$ gas, and a sedimentary gas. The sedimentary gas is not limited to those containing C and F, but may be those containing C and F and H. For example, one example of a gas containing C and F in a second gas or a gas containing C and F and H is a $CF_4$ gas, a $C_4F_6$ gas, a $C_4F_6$ gas, and a CHFx gas.

Organic Film Etching Process/To the End

The etching of the organic film 105 is then completed in step S26 of FIG. 5. FIG. 6(e) shows a state in which the etching of the organic film 105 is completed. The etching conditions in the present process are as follows.

Etch Condition

Pressure 13.5 mT to 16.5 mT
HF power 63 W to 770 W
LF power 0 W
DC voltage (top electrode applied) 0 V
Gas type $H_2$, $N_2$ In the present process, an organic film 105 and a protective film 104 deposited on the via bottom are etched until the $SiO_2$ film 106 is exposed. As noted above, this step supplies etchable $H_2$ and $N_2$ gases to the protective film 104 including C, P and silicon. Thus, as shown in FIGS. 2(b) and 6(e), the protective film 104 of the via bottom can be etched by plasma generated from N and H gases. This prevents etching defects such as the remaining via bottom protective film 104 in the present embodiment.

The present process is an example of a third process in which a third gas is introduced and the target film is etched after the step of forming the protective film is performed. The third gas is not limited to the H2 gas and the N2 gas, but includes N and H. However, the third gas is preferably N and H without C or F in order to smoothly etch the protective film 104 containing C, F, and silicon. Preferably, the third gas is different from the first gas. (SiO$_2$ film etching process)

Next, in step S28 of FIG. 5, the SiO$_2$ film 106, which is the final etched target film, is etched and the present process is completed. The etching conditions in the present process are as follows.

Etch Condition

Pressure 13.5 mT to 16.5 mT
HF power 450 W to 550 W
LF power: 2250 W to 2750 W
DC voltage (top electrode applied) 270 V to 330 V
Gas species C$_4$F$_6$, O$_2$, Ar, C$_4$F$_8$ In the present process, the SiO$_2$ film 106 is etched until the lower tungsten electrode is exposed by using the organic film 105 etched till the previous process as a mask. This process is one example of the fourth process of etching the target film to be etched, which is the underlying film of the organic film 105. In the fourth process, the aspect ratio of the film to be etched is 20 or more.

For the above-described sample, etching under the above-described conditions using the substrate processing apparatus 1 can reduce the via diameter by about 30 nm without causing an etching failure.

In the etching method of one embodiment, a process of reducing the via diameter was added during the etching of the organic film 105. This allows the opening width of the SiO$_2$ film 106 to be reduced by about 5 nm to 30 nm without causing an etching failure.

In the present embodiment, the organic film 105 is etched by performing two proceeds: a first process and a third process. In the initial process (the first process), the organic film 105 is etched in the middle with a gas containing O. In the next process (third process), the organic film 105 is etched with a gas containing N and H until the SiO$_2$ film 106 is exposed.

Figure 7:
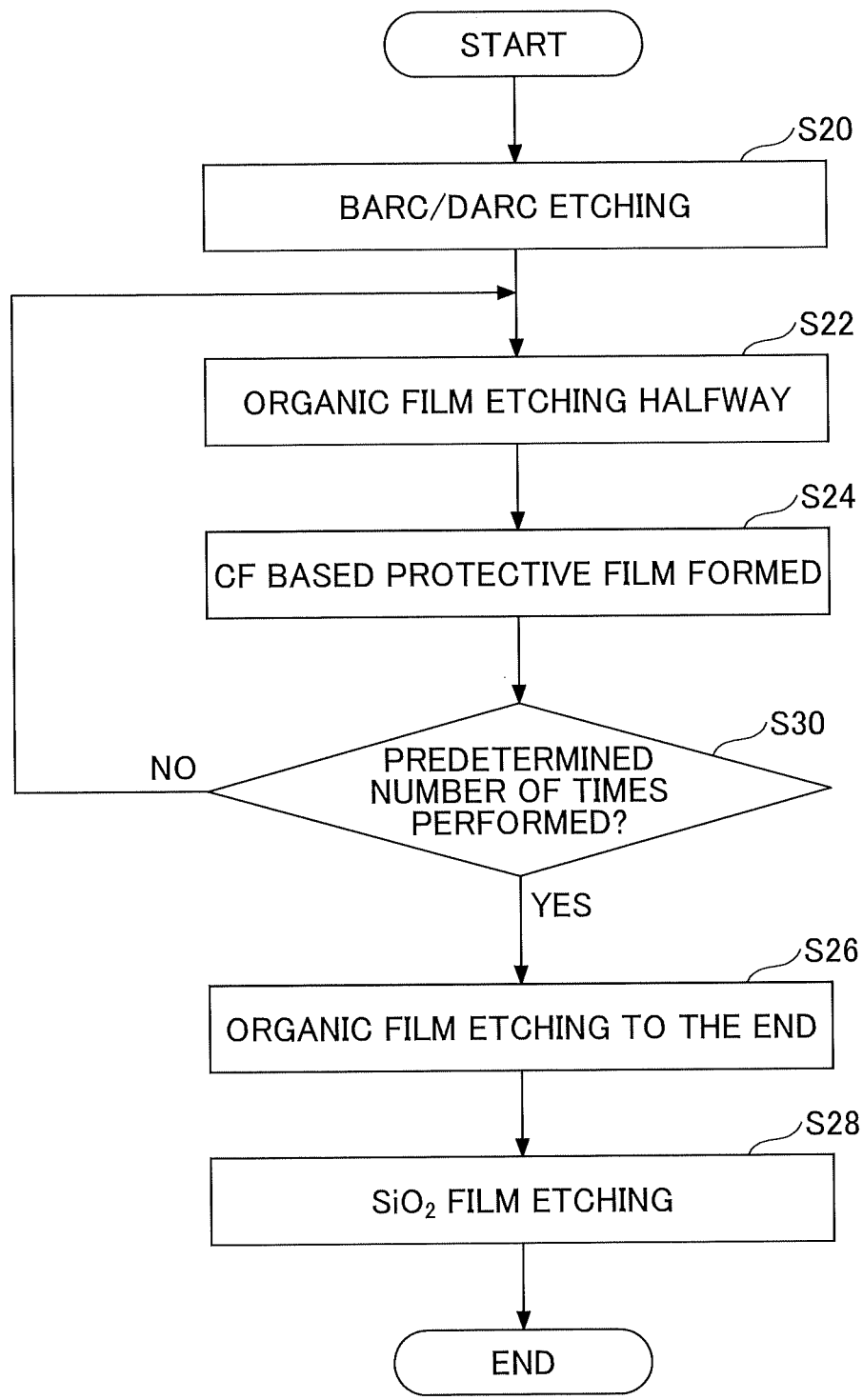
FIG. 7 is a flowchart illustrating an example of an etching process according to a variation of an embodiment.

However, the organic film 105 is not limited to being etched in the above two processes, but may be etched in two or more processes. FIG. 7 is a flowchart illustrating an example of an etching process according to a modification of an embodiment. In the etching method according to the modification, a process of etching the organic film 105 halfway and a process of forming the protective film 104 are performed one or more times (step S30). Then, the organic film 105 is etched to the end (step S26).

Figure 8:
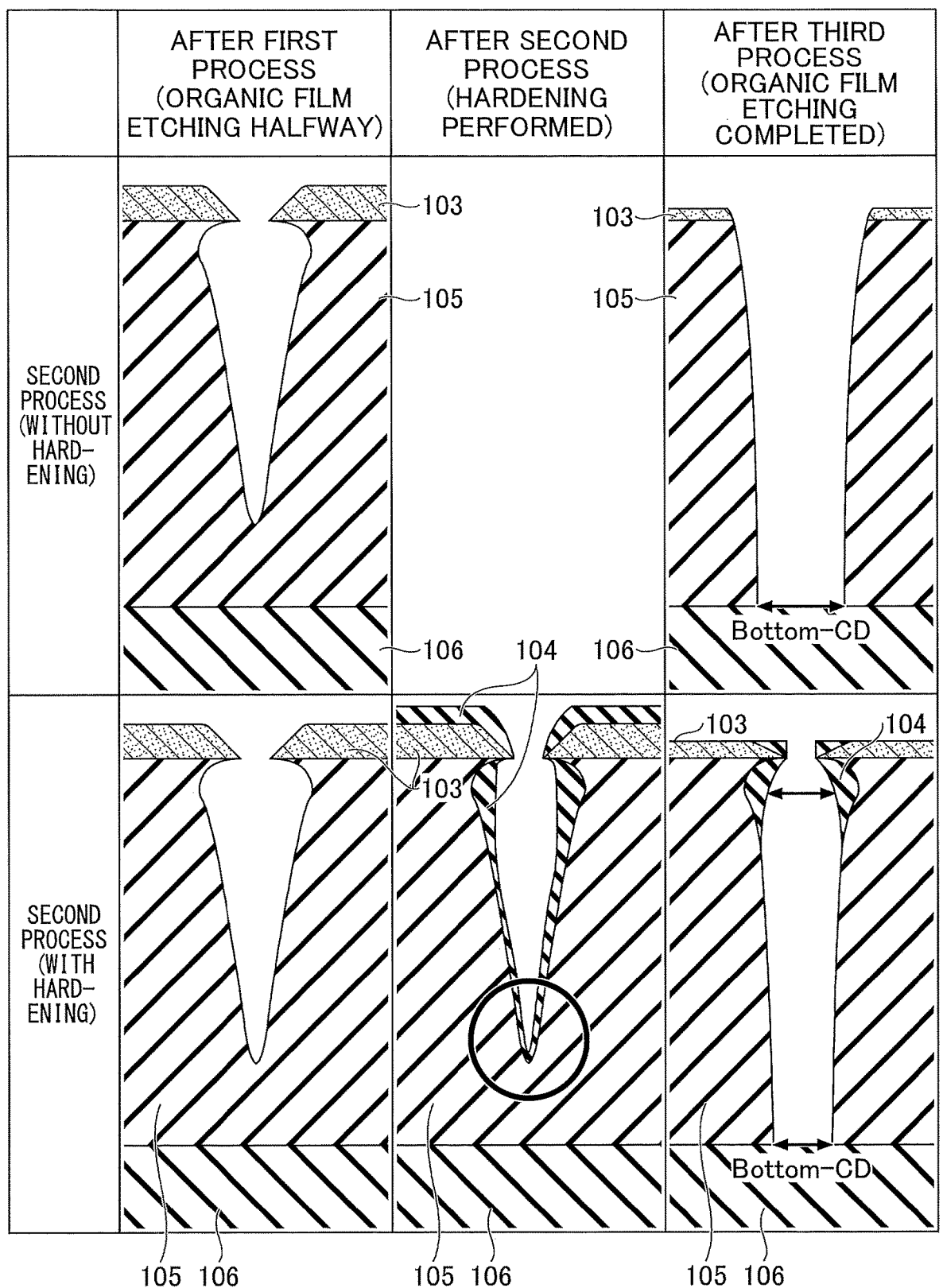
FIG. 8 is a diagram illustrating an etching process according to an embodiment.

FIG. 8 is a diagram illustrating an etching process according to an embodiment. As described above, in one embodiment, as shown in the lower part of FIG. 8, a second process of depositing a protective film 104 after the first process of etching the organic film 105 halfway was performed, followed by a third process of etching the organic film 105. According to this, in the etching method of the present embodiment in which the protective film 104 is formed after etching the organic film 105 in the first process, deposition on the via bottom is inhibited as shown after the second process in the lower center of FIG. 8.

In addition, because the gas for etching the organic film 105 in the third process was made the gas containing N and H, it was possible to etch the CF-based deposit on the via bottom. As a result, the via diameter after the third step shown by the Bottom-CD in the lower right of FIG. 8 was reduced by about 5 nm to 30 nm without an etching failure.

In the etching method according to the modification, the first process and the second process in the lower stage of FIG. 8 are repeated one or more times, and then the third process is performed. This also reduces the via diameter without causing an etching failure. Further, in the etching method according to the modification, the second process of forming the protective film 104 is performed more than once by repeating the first process and the second process. This allows the organic film 105 to be etched while protecting the side walls of the organic film 105, thereby allowing the etching shape to be more perpendicular.

Example of Experimental Results

An example of the experimental results of etching the sample etched by the etching method procedure according to one embodiment will be described with reference to FIGS. 9 and 10, based on each of the above-described process conditions.

Figure 9:
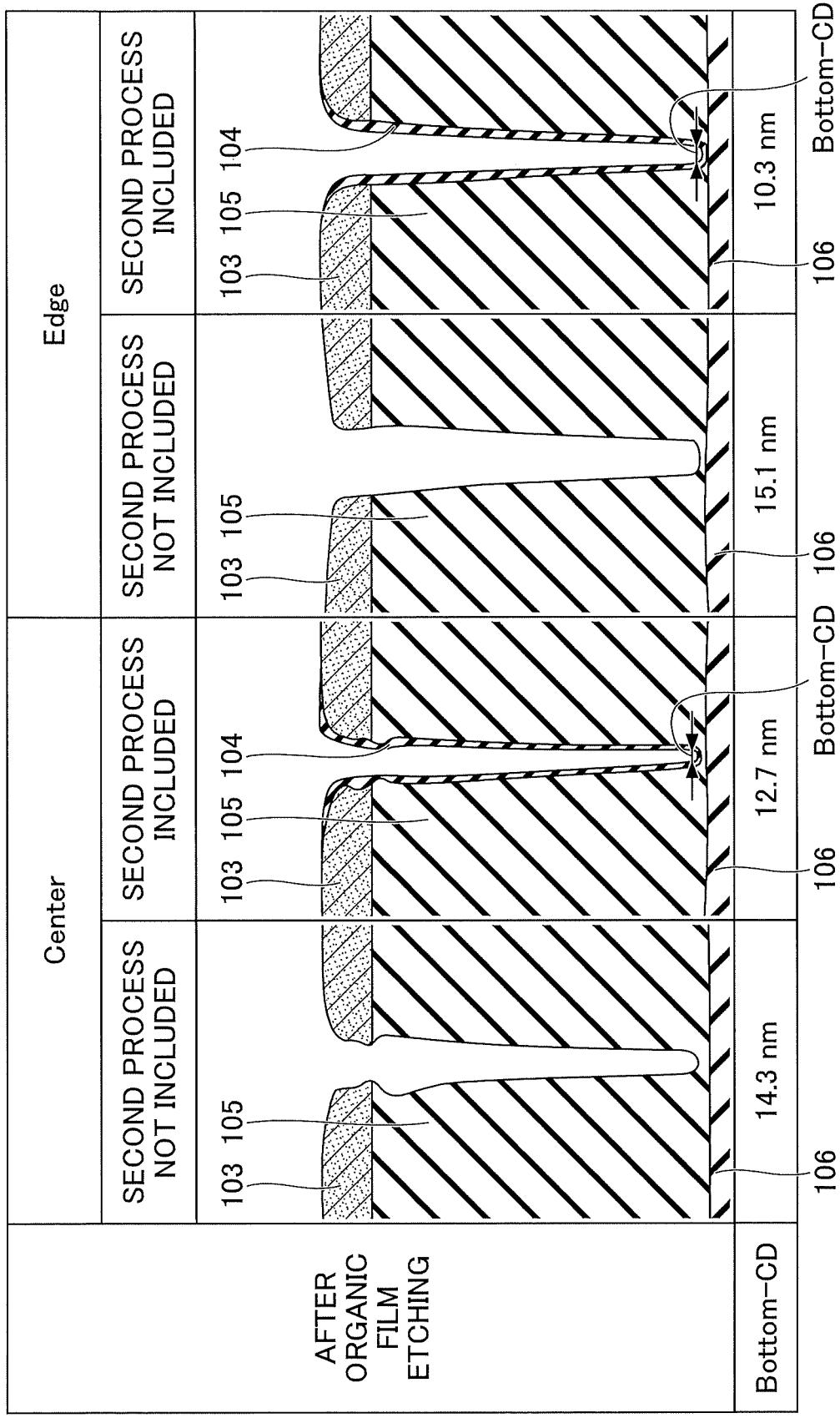
FIG. 9 is a diagram illustrating an example of an experimental result of an etching method according to an embodiment.

FIG. 9 shows an example of the experimental results of etching after the third process (etching the organic film 105 to the end). FIG. 10 shows an example of the experimental results of the etch shape after the fourth process (etching the SiO$_2$ film 106 until the tungsten electrode 107 is exposed).

FIG. 9 shows an example of the experimental result of the cross-sectional shape of the hole etched in the organic film 105 with or without the second process (deposition process) for the elliptically shaped holes at the center and edge of the wafer W. According to this, when the second process is included, the organic film 105 can be etched with a protective film 104 attached to the side wall of the hole through which the organic film 105 is etched.

The third gas that etches the organic film 105 in the third step is less anisotropic in etching, is isotropic, and tends to be laterally etched. However, in the present experimental result, the second process was performed during the etching of the organic film 105 to form the protective film 104. As a result, the organic film 105 could be etched by the third gas in the third process with the side wall of the hole protected by the protective film 104. Accordingly, the Bottom-CD after etching the organic film 105 in the third process can be reduced by about 2 nm to 5 nm at both the center side and the edge side of the wafer W compared to a case in which the second process is not performed. The Bottom-CD indicates the width of the short-diameter side of the via bottom.

The fourth process (etching the SiO$_2$ film 106) was performed after the third process. FIG. 10 shows an example of the experimental results of the cross-sectional shape of the holes etched in the SiO$_2$ film 106 in the presence or absence of the second process for the oval-shaped holes at the center and edge of the wafer W. The Top-CD shows the opening width of the short diameter side of the opening formed on the top surface of the SiO$_2$ film 106. Max-CD shows the widest short-diameter width of the hole formed in the SiO$_2$ film 106.

According to this, the SiO$_2$ film 106 can be etched to form holes having an aspect ratio of 20 or more without an etching failure such as etch stop. When comparing the case without the second process with the case including the second process, the Top-CD, Max-CD, and Bottom-CD are reduced by about 5 nm to 6 nm in the case of including the second process in both the center side and the edge side. In addition, the variation between the center hole and the edge hole on the Bottom-CD was improved by about 30%. On the other hand, in the case without the second process, the size of each CD was about 1 nm, and almost no reduction was achieved.

As described above, according to the etching method of the present embodiment, the opening width of the target film can be reduced without an etching failure.

The etching method and substrate processing apparatus according to one embodiment disclosed herein are to be considered exemplary in all respects and not limiting. The above embodiments may be modified and modified in various forms without departing from the appended claims and spirit thereof. The matters described in the above embodiments may take other configurations to the extent not inconsistent, and may be combined to the extent not inconsistent.

The substrate processing apparatus of the present disclosure is applicable to all types of Capacity Coupled Plasma (CCP), Inducibly Coupled Plasma (ICP), Radial Line Slot Antenna (RLSA), Electron Cyclotron Resonance Plasma (ECR), and Helicon Wave Plasma (HWP).

Wafer W has been described herein as an example of a substrate. However, the substrate may not be limited thereto, but may be a variety of substrates used in the Liquid Crystal Display (LCD) or the Flat Panel Display (FPD), a CD substrate, a printed circuit board, or the like.

This international application is based upon and claims priority to Japanese Patent Application 2018-127816, filed Jul. 4, 2018, the entirety of which is incorporated herein by reference.

DESCRIPTION OF SYMBOLS 1 substrate processing apparatus
10 processing chamber
16 mounting stage
20 electrostatic chuck
22 dc power supply
34 upper electrode
48 second radio frequency power source
50 variable dc power supply
90 first radio frequency power source
101 photoresist film
102 BARC film
103 DARC film
104 protective film
105 organic film
106 $SiO_2$ film
200 controller

The invention claimed is:

1. An etching method in a substrate processing apparatus having a first electrode on which a substrate is mounted and a second electrode facing the first electrode, comprising:
   a first step of etching a target film on a substrate partially into a pattern of a predetermined film on the target film by introducing a first gas;
   a second step of forming a protective film by introducing a second gas containing Ar gas, $H_2$ gas, and a sedimentary gas and applying a DC voltage to the second electrode after performing the first step; and
   a third step of etching the target film by introducing a third gas after performing the step of forming the protective film, the third gas being different from the first gas.

2. The etching method as claimed in claim 1, wherein the sedimentary gas contains C and F.

3. The etching method as claimed in claim 1, wherein the first gas contains at least any one of $O_2$, $N_2$, $H_2$, CO, $CO_2$ and Ar.

4. The etching method as claimed in claim 1, wherein the protective film contains C and F.

5. The etching method as claimed in claim 1, wherein radio frequency power for plasma generation applied in the first step, the second step and the third step have a frequency in a range from 30 MHz to 70 MHz.

6. The etching method as claimed in claim 5, wherein the radio frequency power for plasma generation is applied to the first electrode or the second electrode.

7. The etching method as claimed in claim 1,
   wherein the predetermined film is at least one of an antireflective film and a hard mask, and
   wherein the target film is an organic film.

8. The etching method as claimed in claim 7, wherein the organic film is an amorphous carbon film.

9. The etching method as claimed in claim 1, wherein the third step is performed after repeating the first step and the second step two or more times.

10. An etching method in a substrate processing apparatus having a first electrode on which a substrate is mounted and a second electrode facing the first electrode, comprising:
   a first step of etching a target film on a substrate partially into a pattern of a predetermined film on the target film by introducing a first gas;
   a second step of forming a protective film by introducing a second gas containing Ar gas, $H_2$ gas, and a sedimentary gas and applying a DC voltage to the second electrode after performing the first step; and
   a third step of etching the target film by introducing a third gas after performing the step of forming the protective film,
   wherein the third gas contains N and H.

11. The etching method as claimed in claim 10, wherein the third gas is $N_2$ and $H_2$.

12. An etching method in a substrate processing apparatus having a first electrode on which a substrate is mounted and a second electrode facing the first electrode, comprising:
   a first step of etching a target film on a substrate partially into a pattern of a predetermined film on the target film by introducing a first gas;
   a second step of forming a protective film by introducing a second gas containing Ar gas, $H_2$ gas, and a sedimentary gas and applying a DC voltage to the second electrode after performing the first step; and
   a third step of etching the target film by introducing a third gas after performing the step of forming the protective film,
   a fourth step of etching a target film to be etched that is an underlying film of the target film,
   wherein an aspect ratio of a recessed pattern bridging the protective film and the target film to be etched is 20 or more.

* * * * *